(12) United States Patent
Chen et al.

(10) Patent No.: US 10,280,512 B2
(45) Date of Patent: May 7, 2019

(54) APPARATUS AND METHOD FOR CARBON FILM DEPOSITION PROFILE CONTROL

(71) Applicant: Varian Semiconductor Equipment Associates, Inc., Gloucester, MA (US)

(72) Inventors: Alex Tsung-Liang Chen, Danvers, MA (US); Simon Ruffell, South Hamilton, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 100 days.

(21) Appl. No.: 14/809,905

(22) Filed: Jul. 27, 2015

(65) Prior Publication Data

US 2017/0029950 A1 Feb. 2, 2017

(51) Int. Cl.
*C23F 1/00* (2006.01)
*C23C 16/52* (2006.01)
(Continued)

(52) U.S. Cl.
CPC .......... *C23C 16/52* (2013.01); *C23C 14/0605* (2013.01); *C23C 14/225* (2013.01); *C23C 14/46* (2013.01); *C23C 14/541* (2013.01); *C23C 16/26* (2013.01); *C23C 16/4586* (2013.01); *C23C 16/486* (2013.01); *C23C 16/505* (2013.01);
(Continued)

(58) Field of Classification Search
CPC ............ A63B 2209/10; A63B 69/0059; A63B 69/3608; A63B 71/146; C23C 14/32; C23C 14/355; C23C 16/278; C23C 16/26; C23C 16/52; C23C 14/0605; C23C 14/225; C23C 14/46; C23C 14/541; C23C 16/4586; C23C 16/486; C23C 16/505; C23C 16/56; H01L 21/02527; H01L 21/02532; H01L 21/0262; H01L 21/02639; H01L 21/223;
(Continued)

(56) References Cited

U.S. PATENT DOCUMENTS

2002/0014407 A1 2/2002 Allen et al.
2009/0205678 A1* 8/2009 Lee ................... H01L 21/67069
134/1.1
(Continued)

FOREIGN PATENT DOCUMENTS

JP 2002540548 A 11/2002

OTHER PUBLICATIONS

ISR and Written Opinion dated Oct. 19, 2016 in corresponding International Patent Application No. PCT/US2016/042488.

*Primary Examiner* — Lan Vinh

(57) ABSTRACT

In one embodiment, an apparatus to selectively deposit a carbon layer on substrate, comprising a plasma chamber to receive a flow of carbon-containing gas; a power source to generate a plasma containing the carbon-containing gas in the plasma chamber; an extraction plate to extract an ion beam from the plasma and direct the ion beam to the substrate, the ion beam comprising ions having trajectories forming a non-zero angle of incidence with respect to a perpendicular to a plane of the substrate, the extraction plate further configured to conduct a neutral species derived from the carbon-containing gas to the substrate; and a substrate stage facing the extraction plate and including a heater to heat the substrate to a first temperature, when the ion beam and carbon-containing species impinge on the substrate.

16 Claims, 6 Drawing Sheets

(51) Int. Cl.
  *C23C 16/26* (2006.01)
  *C23C 16/458* (2006.01)
  *C23C 16/48* (2006.01)
  *C23C 16/505* (2006.01)
  *C23C 16/56* (2006.01)
  *C23C 14/06* (2006.01)
  *C23C 14/22* (2006.01)
  *C23C 14/46* (2006.01)
  *C23C 14/54* (2006.01)
  *H01L 21/02* (2006.01)
  *H01L 21/223* (2006.01)

(52) U.S. Cl.
  CPC .......... *C23C 16/56* (2013.01); *H01L 21/0262* (2013.01); *H01L 21/02527* (2013.01); *H01L 21/02639* (2013.01); *H01L 21/223* (2013.01)

(58) Field of Classification Search
  CPC ..... C07C 31/20; C07C 29/149; C07C 29/177; C07C 51/36; C07C 55/14; C07C 29/80
  USPC .................. 438/710, 711, 712, 714, 717; 156/345.28, 345.39, 345.4, 3, 31, 39, 4
  See application file for complete search history.

(56) References Cited

U.S. PATENT DOCUMENTS

| | | | |
|---|---|---|---|
| 2009/0214800 A1* | 8/2009 | Saito | B01J 19/088 427/577 |
| 2011/0007255 A1* | 1/2011 | Yaroshchuk | C23C 16/26 349/123 |
| 2011/0259408 A1* | 10/2011 | Ramappa | C23C 14/042 136/255 |
| 2012/0289030 A1 | 11/2012 | Godet et al. | |
| 2013/0045339 A1* | 2/2013 | Godet | C23C 14/042 427/577 |
| 2014/0076716 A1* | 3/2014 | Gorokhovsky | H01J 37/32357 204/192.12 |
| 2014/0076718 A1* | 3/2014 | Gorokhovsky | H01J 37/32917 204/192.38 |
| 2014/0202633 A1 | 7/2014 | Godet et al. | |
| 2015/0011093 A1* | 1/2015 | Singh | H01J 37/32422 438/712 |
| 2015/0176116 A1* | 6/2015 | Godet | C23C 14/042 427/577 |

* cited by examiner

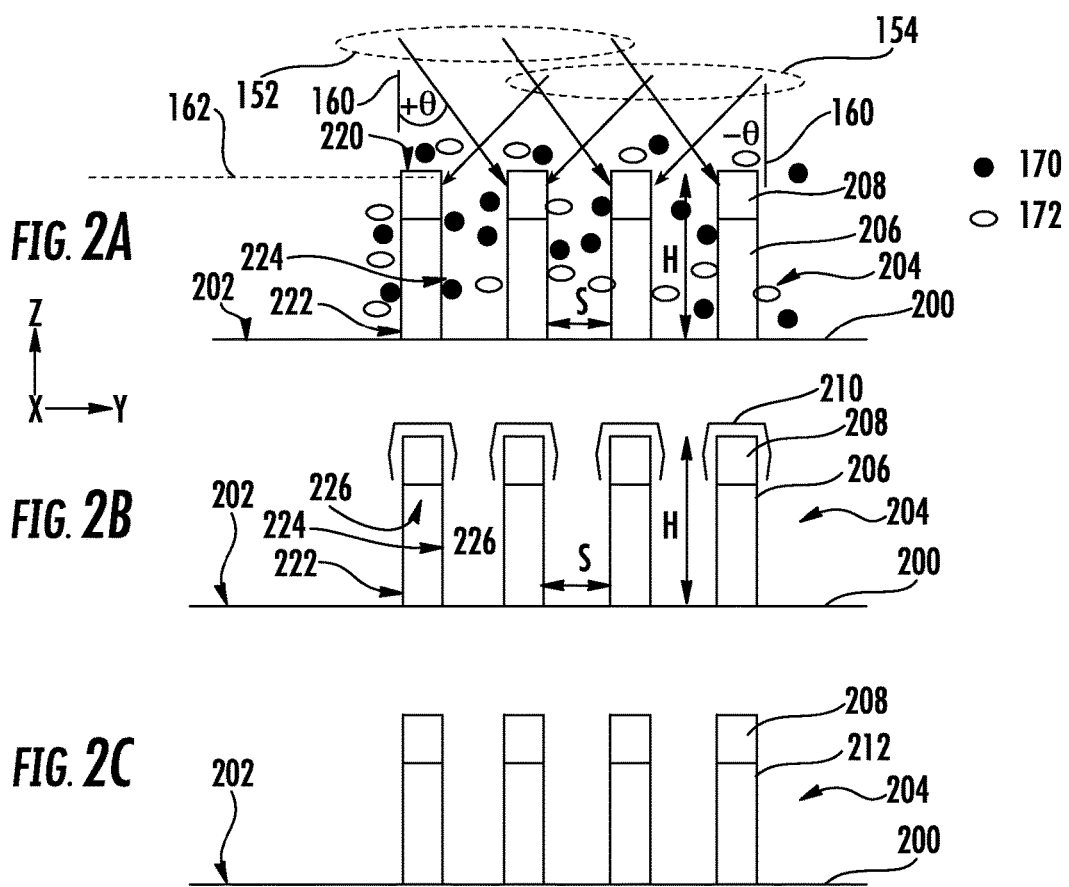

APPARATUS AND METHOD FOR CARBON FILM DEPOSITION PROFILE CONTROL

FIELD

The present embodiments relate to deposition of thin films and coatings and more particularly, to selective deposition of coatings.

BACKGROUND

As integrated devices continue to scale to smaller dimensions, the ability to process small features becomes increasingly difficult. In some examples, generating a target device structure may involve the ability to mask select portions of a device structure. For three dimensional devices such as multigate transistors, masking of target portions of a device may be more difficult than the case for planar devices.

In one example of doping of a finFET (fin field effect transistor), the target region for self-aligned doping may be the bottom part of a fin adjacent the substrate. Accordingly, this type of doping process may call for masking just a portion of the fin.

With respect to these and other considerations the present improvements may be useful.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, an apparatus to selectively deposit a carbon layer on substrate may include a plasma chamber to receive a flow of carbon-containing gas; a power source to generate a plasma containing the carbon-containing gas in the plasma chamber; an extraction plate to extract an ion beam from the plasma and direct the ion beam to the substrate, the ion beam comprising ions having trajectories forming a non-zero angle of incidence with respect to a perpendicular to a plane of the substrate, the extraction plate further configured to conduct a neutral species derived from the carbon-containing gas to the substrate; and a substrate stage facing the extraction plate and including a heater to heat the substrate to a first temperature, when the ion beam and carbon-containing species impinge on the substrate.

In another embodiment, a method to selectively deposit a carbon layer on a substrate may include generating a plasma in a plasma chamber using a carbon-containing gas; directing an ion beam to a first region of the substrate, the ion beam comprising ions extracted from the plasma, and the ions having trajectories forming a non-zero angle of incidence with respect to a perpendicular to a plane of the substrate; and heating the substrate to a first temperature, wherein the carbon layer deposits at a first deposition rate in the first region of the substrate, and deposits at a second deposition rate less than the first deposition rate in a second region of the substrate, the second region being unexposed to the ion beam.

In another embodiment, a method to selectively deposit a carbon layer on a substrate may include providing at least one substrate feature on the substrate; generating a plasma in a plasma chamber using a hydrocarbon gas; directing a first ion beam to a first portion of the substrate feature, the ion beam comprising ions extracted from the plasma, and the ions forming a non-zero angle of incidence with respect to a perpendicular to a plane of the substrate; an heating the substrate to a first temperature, wherein the carbon layer deposits at a first deposition rate in the first portion of the substrate feature, and deposits at a second deposition rate less than the first rate in a second portion of the substrate feature, the second portion being unexposed to the ion beam.

BRIEF DESCRIPTION OF THE DRAWINGS

FIG. 2A through FIG. 2C depict an example of substrate processing according to embodiments of the disclosure;

DETAILED DESCRIPTION

Figure 1A:
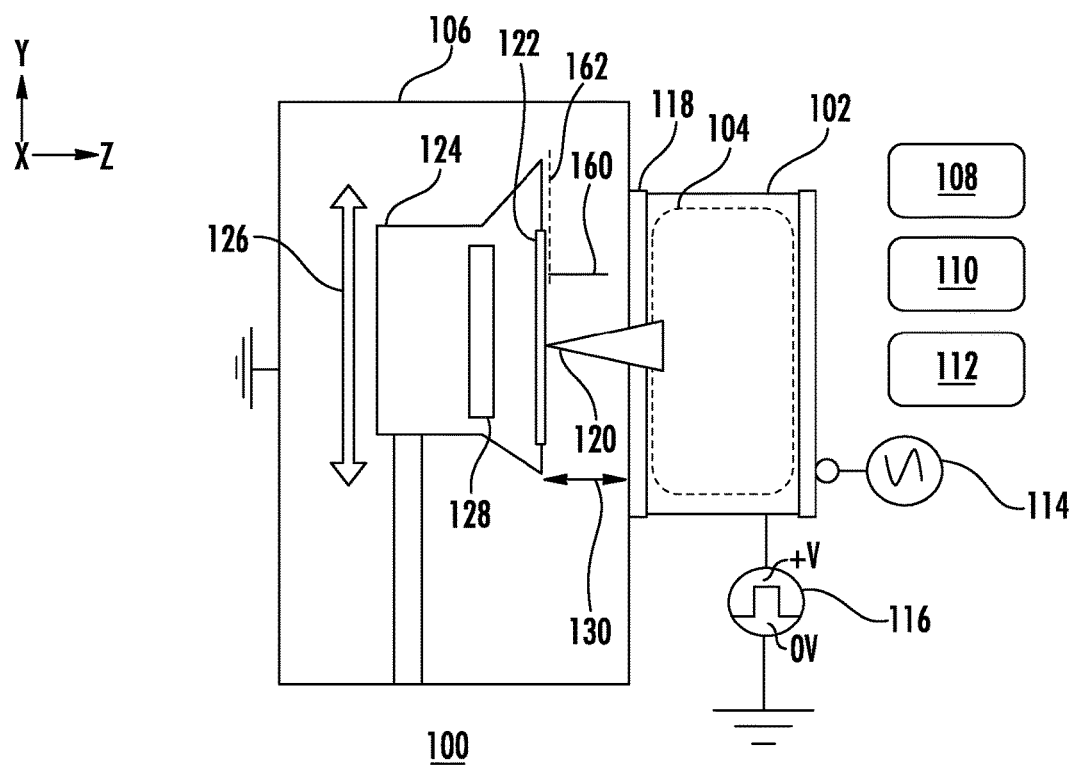
FIG. 1A depicts a system according to embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

This present embodiments provide novel apparatus and novel techniques to treat substrates and in particular novel apparatus and techniques to treat a substrate surface, such as to selectively deposit a layer. In particular embodiments, selective deposition may be applied to deposit a carbon layer at a first rate in a first region of a substrate, and to deposit the carbon layer at a second rate less than the first rate in a second region of the substrate. In various embodiments, the selective deposition may be applied to a substrate feature, wherein the carbon layer deposits at a first rate in a first portion of the substrate feature and at a second rate in the second portion of the substrate feature. In this manner a deposition profile of a carbon layer may be tailored to a given application. As used herein, the term "carbon layer" refers to a layer including carbon, where the layer may additionally include hydrogen. As used herein the term "substrate feature" may refer to a feature disposed on an outer surface of a substrate where the feature has a surface or surfaces that extend along different directions. Examples of substrate features include lines, pillars, mesas, trenches, and vias. The embodiments are not limited in this context.

FIG. 1A depicts a system 100 according to embodiments of the disclosure. The system 100 includes a plasma chamber 102. The plasma chamber 102 may house a plasma 104 as illustrated. The system 100 further includes a process chamber 106. The system 100 may include at least one gas source to provide gas to the plasma chamber 102. In the embodiment depicted in FIG. 1A, the system 100 includes a first gas source 108, a second gas source 110, and a third gas source 112. The system 100 may further include a power source, shown as the plasma source 114, to generate power to ignite and sustain the plasma 104. The plasma source 114 may be an RF plasma source, inductively-coupled plasma (ICP) source, capacitively coupled plasma (CCP) source, helicon source, electron cyclotron resonance (ECR) source), indirectly heated cathode (IHC) source, glow discharge source, or other plasma sources known to those skilled in the art. The system 100 further includes a bias supply 116 coupled to the plasma chamber 102.

The bias supply 116 may be configured to generate a voltage difference between the plasma chamber 102 and a substrate stage 124 disposed in the process chamber 106. In the embodiment of FIG. 1A, the bias supply 116 may bias the plasma chamber 102 positively with respect to ground potential, while the process chamber as well as substrate stage 124 are held at ground potential. When a plasma 104 is present in the plasma chamber 102, and the bias supply 116 biases the plasma chamber 102 positively with respect to ground potential, an ion beam 120 comprising positive ions may be extracted from the plasma 104. The ion beam 120 may be extracted through an extraction plate 118, and may be directed into the process chamber 106 to a substrate 122 held on the substrate stage 124. In various embodiments, the substrate stage may be movable with respect to the extraction plate 118. The substrate stage 124 may be movable, for example along a direction parallel to the Z-axis of the Cartesian coordinate system shown. In this manner, a separation 130 may be varied between the surface of the substrate 122 and extraction plate 118. In various embodiments, the substrate stage 124 may be configured to scan the substrate 122 with respect to the extraction plate 118 along a direction parallel to the plane 162 of the substrate 122. For example, the substrate stage 124 may be movable back and forth along the direction 126, parallel to the Y-axis. As further shown in FIG. 1a, the substrate stage 124 may include a heater 128 to heat the substrate 122.

In accordance with various embodiments of the disclosure, the first gas source 108 may provide a carbon-containing gas, such as a hydrocarbon gas, for depositing a carbon film. Examples of a hydrocarbon gas include methane or other gas. The embodiments are not limited in this context. The second gas source 110 may provide an inert gas, while the third gas source 112 may provide hydrogen. In some embodiments, at least the first gas source 108, providing methane or other hydrocarbon gas, may be used to generate the plasma 104, while the second gas source 110, third gas source 112, or second gas source 110 and third gas source 112 may optionally provide additional gas flows to the plasma chamber 102. The ion beam 120 may thus include carbon-containing ions such as hydrocarbon ions and inert gas ions, for example.

The extraction plate 118 may further be configured to conduct a neutral species derived from the carbon-containing gas in plasma chamber 102 to the substrate 122. For example, a methane gas may be introduced into the plasma chamber 102 to generate a plasma that includes ions derived from methane. In addition, various neutral gas species such as radicals including $CH_3$, $CH_2$, and so forth, may be generated in plasma chamber 102. These unionized species may stream from the plasma chamber 102 into the process chamber 106. In particular radical hydrocarbon species may deposit to form a carbon layer at least on certain regions of the substrate 122. As detailed below, the ion beam 120 or similar ion beams may be directed to the substrate 122 in a manner that selectively deposits the carbon layer.

Figure 1B:
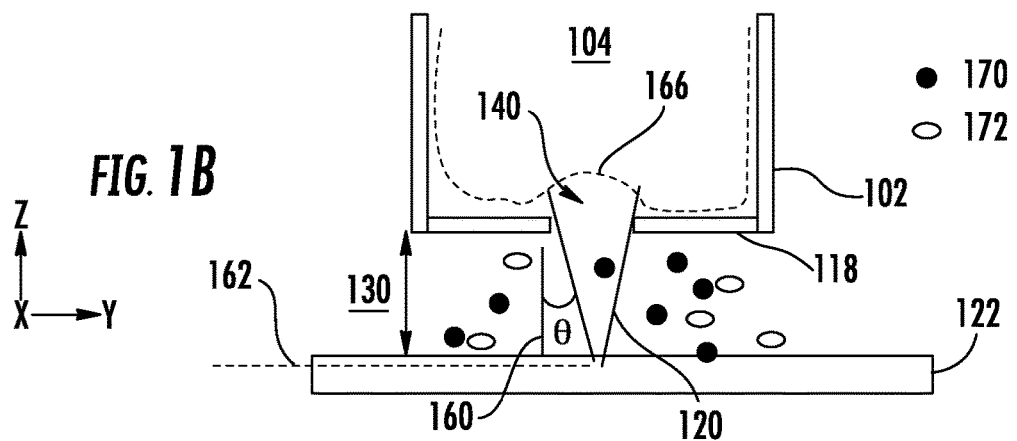
FIG. 1B depicts details of geometry of a processing apparatus and substrate according to various embodiments.
Figure 1C:
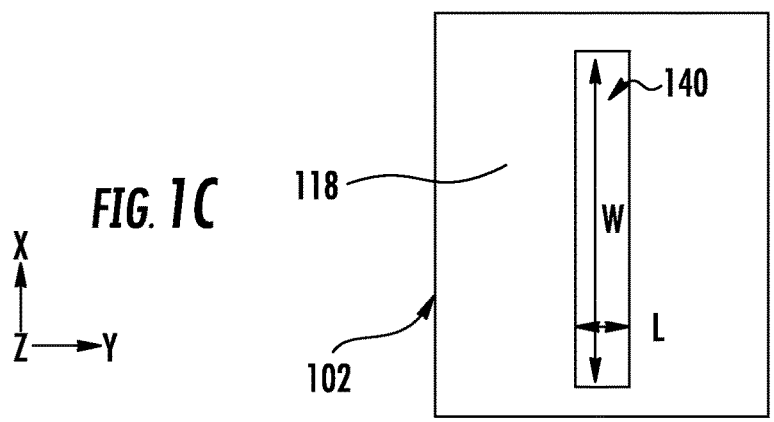
FIG. 1C depicts a plan-view of an embodiment of an extraction plate.

FIG. 1B depicts details of geometry of a processing apparatus and substrate according to various embodiments. In particular, a plasma chamber 102 and extraction plate 118 are shown. The plasma chamber 102 and extraction plate 118 may be included in the system 100 as described above. In the scenario of FIG. 1B the plasma 104 is generated in the plasma chamber 102. As shown in FIG. 1B, the extraction plate 118 includes an extraction aperture 140, where the ion beam 120 is extracted through the extraction aperture 140 and directed to the substrate 122. FIG. 1C depicts a plan-view of an embodiment of the extraction plate 118. In this example the extraction aperture 140 has a width W along the X-axis and a length L along the Y-axis, where W is greater than L. In some examples W may have a value in the range of 150 mm to 300 mm or greater, while L has a value of 3 mm to 30 mm. The embodiments are not limited in this context. The ion beam 120 may accordingly be extracted through the extraction aperture 140 as a ribbon beam having a beam width greater than a beam length.

In the example where the plasma 104 is formed from a hydrocarbon gas, the ion beam 120 may include ions derived from the hydrocarbon gas as discussed above. Additionally, neutral species 172, including hydrocarbon radicals, may stream from the plasma chamber 102 and may deposit on the substrate 122. As further shown in FIG. 1B hydrogen species 170 may stream from the plasma chamber 102 and may impact the substrate 122. In accordance with various embodiments, the deposition rate of the carbon film may be enhanced in regions where the ion beam 120 impacts the substrate with respect to regions where the ion beam does not impact the substrate. In various embodiments the ion beam 120 may comprise ions having trajectories forming a non-zero angle of incidence, shown in FIG. 1B as θ, with respect to a perpendicular 160 to a plane 162 of the substrate 122, where the plane 162 may lie parallel to the X-Y plane. In some examples, the non-zero angle of incidence spans a range up to 75 degrees with respect to the perpendicular 160.

The ions of ion beam 120 may have trajectories distributed over a range of angles of incidence. As further shown in FIG. 1B, the plasma 104 may define a plasma sheath boundary that forms a meniscus 166 adjacent the extraction aperture 140. Ions extracted from the plasma 104 may accelerate at normal trajectories with respect to the plasma sheath boundary, and may therefore exit the plasma from the region of the meniscus 166 over a range of angles defined by the curvature of the meniscus 166. In accordance with embodiments of the disclosure, system parameters of a system such as system 100 may be varied to adjust the exact distribution of angles of incidence and average angle of incidence of ions in ion beam 120. Examples of a system parameter affecting the distribution of angles of incidence of ions in ion beam 120 include level of RF power applied to the plasma chamber 102, RF waveform, extraction voltage of the ion beam applied by the bias supply 116, or separation 130 between substrate 122 and extraction plate 118. Tuning the distribution of angles of incidence of the ion beam 120 may afford the ability to adjust a carbon film deposition profile on a substrate, including the ability to selectively deposit a carbon layer on some region(s) of a substrate feature while not depositing the carbon layer on other region(s) of the substrate feature.

Figure 1D:
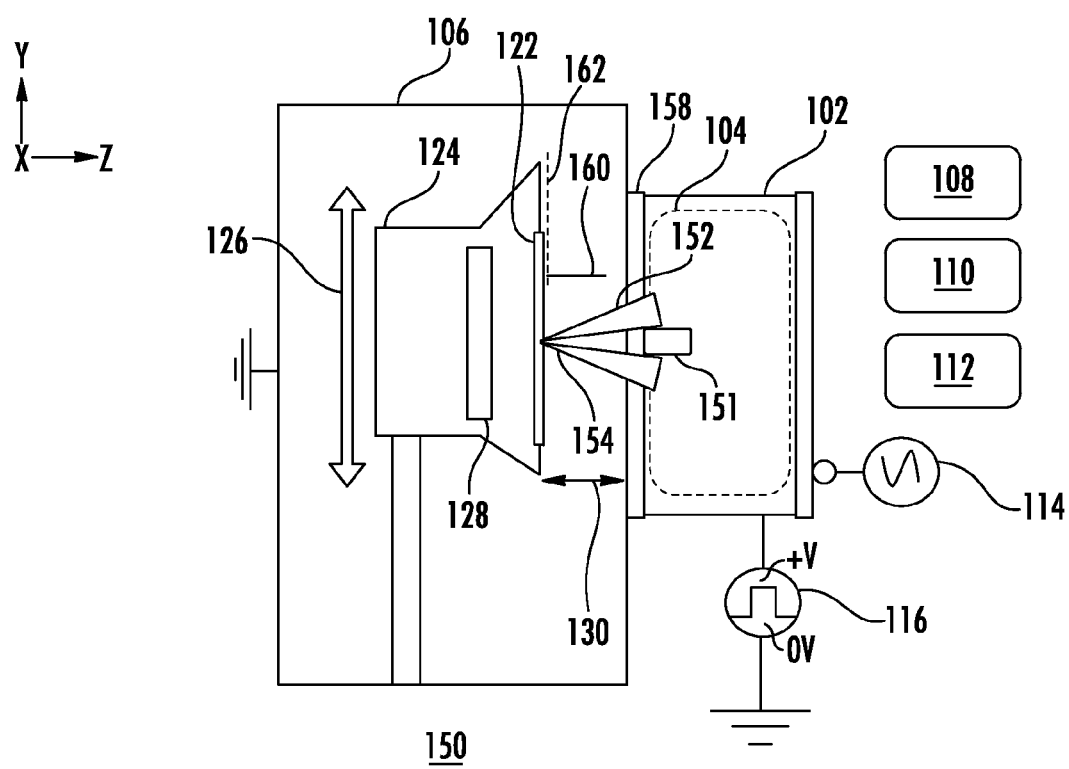
FIG. 1D depicts another system according to additional embodiments of the disclosure.

FIG. 1D depicts another system 150 according to additional embodiments of the disclosure. The system 150 may have similar components to those of system 100, where the similar components are labeled the same. The system 150 may differ from system 100 in the geometry of extraction of ions from the plasma chamber 102. In the embodiment specifically shown in FIG. 1D system 150 includes a beam blocker 151 disposed within the plasma chamber 102 adjacent an extraction plate 158. The extraction plate 158 may have an extraction aperture similar in shape to extraction aperture 140 such as being elongated along the X-axis with respect to the Y-axis. The beam blocker 151 and extraction plate 158 may be interoperative to extract ions from plasma 104 forming an ion beam 152, and to extract additional ions from the plasma in a second ion beam, shown as ion beam 154, wherein the ion beam 152 defines a first angle of incidence with respect to the perpendicular 160 and the second ion beam, ion beam 154, defines a second angle of incidence with respect to the perpendicular 160. This embodiment may be useful to treat different regions of a substrate feature to promote selective deposition of a layer, such as a carbon layer.

FIG. 2A and FIG. 2B depict an example of substrate processing according to embodiments of the disclosure. In the scenario of FIG. 2A, a substrate 200 is provided, where the substrate 200 includes substrate features 140. The substrate features 140 are shown along an end view in the Y-Z plane. The substrate features 140 may represent an array of lines or an array of pillars that extend above a surface 202 of the substrate 200. In FIG. 2A an ion beam 152 is directed to the substrate 200, as represented by the arrows directed downwardly to the right, while an ion beam 154 is directed to the substrate 200, as represented by the arrows directed downwardly to the left. The ion beam 152 and ion beam 154 may be formed as described above. In some embodiments the ion beam 152 and ion beam 154 may spatially overlap when impacting the substrate 200, as suggested by FIG. 2A. In some examples, the ion beam 152 and ion beam 154 may have dimensions on the order of millimeters or tenths of millimeters along the Y-axis as shown when impacting the substrate 200. In some embodiments, the patterned features may have dimensions on the order of micrometers or nanometers along the Y-axis. Accordingly, the ion beam 152 and ion beam 154 may simultaneously impact the substrate features 140. In other embodiments, the ion beam 152 and ion beam 154 may be spatially separated when impacting the substrate 200. The scenario of FIG. 2A may be accomplished by scanning the substrate 200 with respect to an extraction aperture, for example, using the apparatus of FIG. 1D.

In some examples the substrate 122 may have dimensions along the Y-axis, for example, of 10 cm, 20 cm, 30 cm, or greater, and may be populated with substrate features 140 over the surface of substrate 122. In this scenario, the substrate 122 may be scanned back and forth with respect to the extraction plate 158 along the Y-direction in order to expose the substrate features 140 to treatment on sidewall 222 as well as sidewall 224. For example, in one instance the ion beam 152 and ion beam 154 may have a width on the order of several millimeters or less when the ion beams impact substrate 122, Accordingly, the substrate 122 may be scanned back and forth for a distance of 30 cm, for example, wherein the entirety of substrate features 140 located on the substrate 122 may be exposed to the ion beam 152 and ion beam 154, ensuring that the sidewalls 222 and sidewalls 224 are impacted for the substrate features 140 distributed across the substrate 122.

In the example of FIG. 2A, at least some ions of ion beam 152 may have trajectories that form an angle of incidence +θ with respect to the perpendicular 160, while at least some ions of ion beam 152 may have trajectories that form an angle of incidence −θ with respect to the perpendicular 160.

As shown in FIG. 2A, the ions of ion beam 152 may strike the left sidewalls of substrate features 140, while the ions of ion beam 152 may strike the right sidewalls of substrate features 140. The substrate features 140 may be characterized by a height H and a spacing S between adjacent substrate features 140. Accordingly the substrate features 140 may shadow one another wherein just a first portion 208, disposed toward the top of a substrate feature 140, is impacted by the ion beam 152 or ion beam 154. A second portion 206 may be shadowed by adjacent substrate features 140, wherein the second portion 206 is not impacted by the ion beam 154 or ion beam 152. Notably, in FIG. 2A four substrate features are shown, while in some implementations additional substrate features 140 may extend to the right and left of those features in the FIG. 2A.

Accordingly, in the example of FIG. 2A, as well as other embodiments, a first ion beam may be directed to just a first part of a first sidewall of a substrate feature while a second ion beam is directed to just a first part of a second sidewall of the substrate feature. Other portions of the first sidewall or second sidewall may be unexposed to the ion first ion beam or second ion beam.

In various embodiments, the ion beams 152 and ion beam 154, like ion beam 120 discussed above, may be extracted from a plasma generated from a flow of carbon-containing gas. Accordingly, the ion beam 152 and ion beam 154 may thus include carbon-containing ions such as hydrocarbon ions. Additionally, in the embodiment of FIG. 2A, neutral species 172, including hydrocarbon radicals, may stream toward the substrate features deposit on the substrate 122. As further shown in FIG. 1B hydrogen species 170 may stream from the plasma chamber 102 and may begin depositing on the substrate 200. Because the neutral species 172 do not carry charge the neutral species 172 may exhibit more random trajectories than the trajectories of ions of ion beam 152 and ion beam 154. Accordingly, in addition to the first portion 208, the neutral species 172 may tend to impact portions of the substrate features 140 not impacted by the ion beam 152 and ion beam 154.

As additionally shown in FIG. 2A, hydrogen species 170 may be provided to the substrate 200. In some examples, the neutral species 172 and hydrogen species 170 may be derived from the same gas species that produces the ion beam 152 and ion beam 154, such as methane. In some instances hydrogen species may 170 be provided, at least in part, from a separate flow of hydrogen gas from a gas source, as described above with respect to FIG. 1A, for example. At least some of the hydrogen species 170 may also be provided to the substrate 200 in a neutral state, where the hydrogen species 170 tend to impact, in addition to the first portion 208, additional portions of the substrate features 140 not impacted by the ion beam 152 or ion beam 154.

During the scenario of FIG. 2A the neutral species 172, such as hydrocarbon radicals, may tend to condense on surfaces that are impacted including the top surface 220 and sidewall 222, and sidewall 224 of substrate features 140. At the same time, hydrogen species 170 may tend to etch carbon-containing material. Accordingly, in the scenario of FIG. 2A, growth of a layer of carbon on the substrate 200 (including substrate features 140) may be determined in part by a competition between deposition from hydrocarbon radicals and etching of material by hydrogen. According to various embodiments, in the scenario of FIG. 2A, the substrate 200 may be heated above room temperature, such as to a temperature greater than 100° C. In some examples the substrate temperature may be set in the range of 100° C. to 300° C. The embodiments are not limited in this context.

The substrate temperature may be chosen to enhance the effect of hydrogen species on etching of a depositing carbon layer, as described in more detail below. In particular, the etch rate of a carbon layer subjected to hydrogen species may vary with temperature.

In various embodiments, the nature of depositing material, such as a carbon layer condensing from the neutral species 172, may be affected by exposure to the ion beam 154 and ion beam 152. In particular, material depositing on the first portion 208, being impacted by either ion beam 154 or ion beam 152, may be rendered more dense as opposed to material depositing on the second portion 206. In addition, the material depositing on the first portion 208 may be less susceptible to etching by species such as hydrogen species 170 in comparison to material depositing on second portion 206. This difference may be enhanced at elevated substrate temperatures above 100° C.

As a consequence, selective growth of a layer, such as a carbon layer, may be achieved where growth is enhanced on the first portion 140.

FIG. 2B depicts a scenario for the substrate 200 after the exposure of FIG. 2A. As shown, a selective carbon layer 210 has been grown on the first portion 208 while no carbon layer is present on the second portion 206 of substrate features 140. Notably, in other examples, a thinner layer of carbon may be grown on the second portion 206. This may be accomplished by adjusting the substrate temperature or adjusting ion energy in an ion beam(s).

In further embodiments selective deposition of a layer such as selective carbon layer 210 may be promoted on endwalls 226 of the surface features 140 by rotating the substrate 200 90 degrees within the X-Y plane, for example, with respect to an extraction aperture. In this manner the ion beam 152 and ion beam 154 may be directed to endwalls 226.

The process of selective deposition provided by FIGS. 2A and 2B may be exploited for various applications. In one example, selective doping of a device structure may be accomplished. For example, the substrate features 140 may represent fin portions of a finFET device. Selective doping of the fin portions may be accomplished wherein the selective carbon layer 210 is used as a mask to prevent doping. FIG. 2C depicts an example of a device structure after selective doping process. In this example, the substrate 200 of FIG. 2B may be exposed to a doping process wherein dopants are prevented from entering the fin structures, substrate features 140, by the presence of the selective carbon layer 210. Accordingly, selectively doped regions 212 are formed, such may coincide with the second portion 206.

In further embodiments, an apparatus such as that shown in FIG. 1D may be arranged so a beam blocker generates just one ion beam directed at a substrate, such as just the ion beam 152 or just the ion beam 154. In this manner, during one exposure to an ion beam, just one sidewall such as sidewall 222 or sidewall 224 may be impacted by an ion beam while the other sidewall is not. In this manner just one sidewall or just one portion of a sidewall may be coated by a carbon layer using the processes generally described above with respect to FIGS. 2B and 2C. In other embodiments, to impact two different sidewalls using a configuration that provides just one ion beam such as ion beam 152 or ion beam 154, a substrate may be rotated 180 degrees between a first scan and a second scan.

Figure 3A:
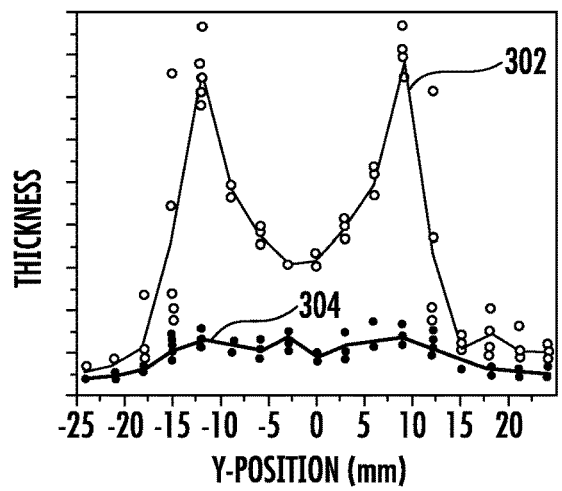
FIG. 3A depicts experimental results of selective deposition according to an embodiment of the disclosure.
Figure 3B:
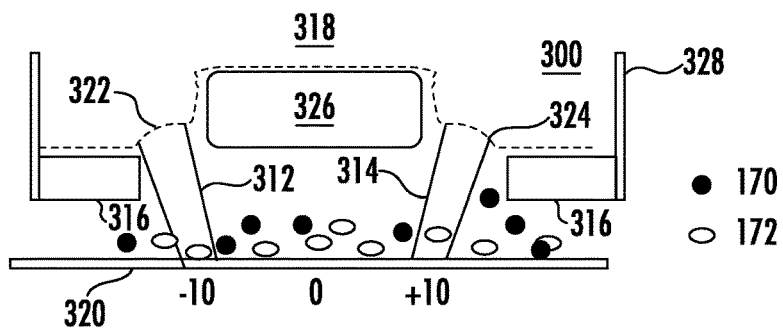
FIG. 3B depicts the geometry of an apparatus and substrate for generating the results of FIG. 3A.

Experiments have been conducted to examine the effect on selective deposition of a carbon film using concurrent exposure to ion beams. FIG. 3A depicts experimental results of selective deposition according to an embodiment of the disclosure while FIG. 3B depicts the geometry of an apparatus and substrate for generating the results of FIG. 3A. In FIG. 3A the experimental results are presented as a graph that plots carbon film thickness as a function of position on a substrate, such as the substrate 320 shown in FIG. 3B. The results are generated by deposition in an apparatus such as apparatus 300. The apparatus 300 may be arranged generally as the system 150 described above. In this example, an extraction plate 316 and beam blocker 326 are arranged to define a meniscus 322 and meniscus 324 at the plasma sheath boundary of the plasma 318. An ion beam 312 is extracted from the meniscus 322 and an ion beam 314 is extracted from the meniscus 324. In this example, the plasma 318 is formed using methane gas ($CH_4$). The majority of flux of the ion beam 312 is located within a few millimeters of the −10 millimeter position, while a majority of the flux of ion beam 314 is located within a few millimeters of the +10 millimeter position. As further shown, hydrogen species 170 and neutral species 172 may stream toward the substrate 320, resulting in deposition of a carbon film.

In the example of FIG. 3A substrate temperature was 250° C., a temperature arranged to enhance the effect of hydrogen etching on a depositing carbon layer. The curve 304 represents an average of layer thickness measurement data (shown as dots) when the plasma 318 is generated and no bias is applied between plasma chamber 328 and substrate 320. In this scenario, neutral species 172, hydrogen species 170, and ions may stream from the plasma chamber 328 and impact the substrate 320. The plasma potential may be just 5 volts to 20 volts more positive with respect to the substrate 320, so any ions impacting the substrate 320 may have energy on the order of several eV or so. As a result, the thickness of the deposited layer as shown by curve 304 is relatively constant between +10 mm and −10 mm, approximately 2 nm. The curve 302 represents an average of layer thickness measurement data when a bias of hundreds of volts is applied between the plasma chamber 328 and substrate 320. In this example, well defined ion beams, as represented by ion beam 312 and ion beam 314 are formed, where the ions have an energy of hundreds of eV. Unlike curve 304, the curve 302 shows a bimodal distribution of layer thickness, where a peak in layer thickness occurs at approximately +10 mm and −10 mm.

Figure 4:
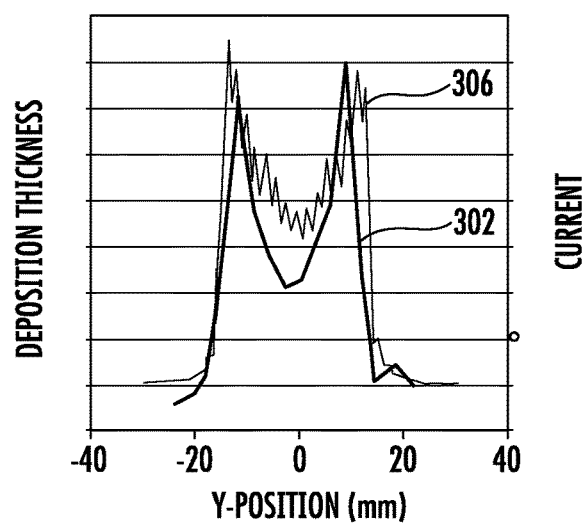
FIG. 4 depicts a comparison of beam current and deposition profiles according to the embodiment shown in FIGS. 3A and 3B.

FIG. 4 depicts a comparison of beam current and deposition profiles according to the embodiment shown in FIGS. 3A and 3B. In particular a beam current curve 306 is shown, superimposed on the curve 302, where the two curves are plotted on a linear scale (Y-axis). As illustrated, the beam current curve shows the same bimodal distribution as the curve 302.

The above results illustrate that selective carbon deposition may be accomplished using ion beams extracted from a plasma derived from hydrocarbon gas. Not limited to an interpretation, the above results may be explained, at least in part, as a result of the competing mechanisms discussed above. While neutral species 172 may tend to deposit a carbon layer, hydrogen species 170 may tend to etch the depositing layer. Moreover, the etching of an undensified carbon layer by hydrogen may be accentuated at elevated temperature. Accordingly, an ion beam having sufficient energy, such as above 50 eV, may be used to enhance selective deposition of carbon by selectively treating target regions of a substrate, rendering those regions less susceptible to etching by hydrogen.

Although the results of FIGS. 3A, 3B, and 4 are derived from methane based plasma, where hydrogen species may be a product of decomposition of methane, in further embodiments, hydrogen may be added to independently control the degree of etching. Moreover, while ions derived from methane were used to generate the ion beams, in additional embodiments, inert gas from an inert gas source may be provided to independently control the degree of densification caused by exposure to ion beams.

While the results shown in FIG. 3A are derived from deposition on a planar surface of a substrate, the selective deposition of carbon in regions impacting an ion beam may be applied to selectively deposition on substrate features, such as sidewalls as discussed with respect to FIGS. 2A to 2C. Additionally, because ions may be directed at a non-zero angle of incidence with respect to a perpendicular, the ions may impact multiple different surfaces of a substrate feature, where the different surfaces are oriented along different directions, including along a perpendicular. In this manner, the profile of a deposited carbon film may be tailored according to the shape of the substrate feature, and the angle of incidence of ion beam.

Figure 5:
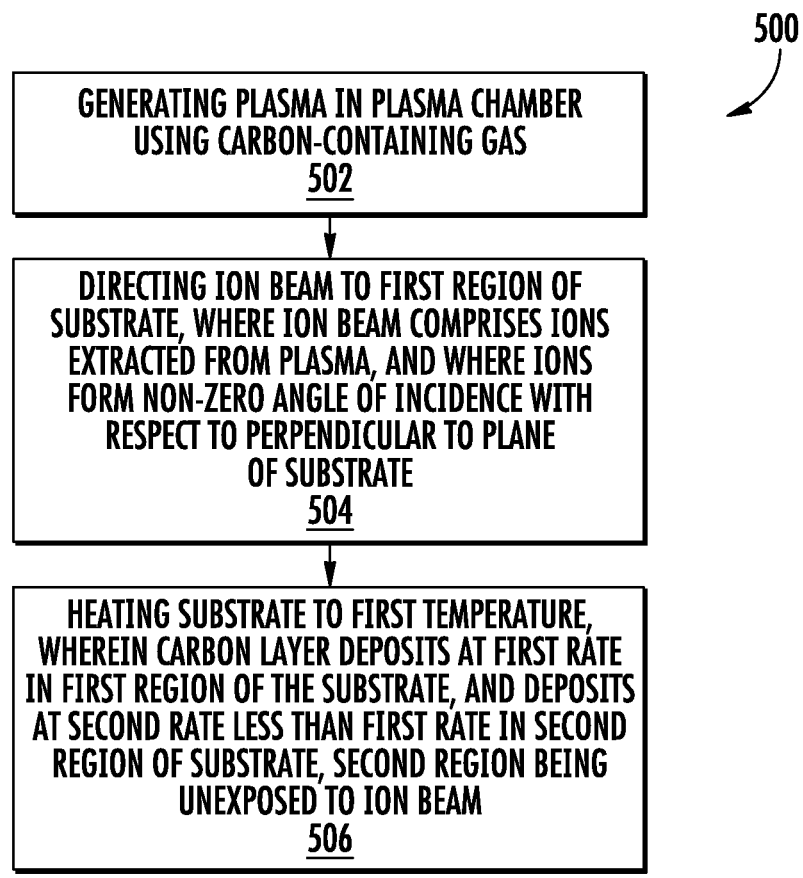
FIG. 5 depicts an exemplary flow.

FIG. 5 depicts an exemplary process flow 500. At block 502, the operation is performed of generating a plasma in a plasma chamber using a carbon-containing gas. In various embodiments, the carbon-containing gas may be a hydrocarbon gas such as methane or mix of hydrocarbon gases. In some embodiments inert gas may be provided in addition to the carbon-containing gas. In some embodiments a mixture of inert gas, hydrocarbon gas, and hydrogen gas may be provided. At block 504, an ion beam is directed to a first region of the substrate, where the ion beam comprises ions extracted from the plasma. The ions may have trajectories forming a non-zero angle of incidence with respect to a perpendicular to a plane of the substrate. In some embodiments the ion beam may be extracted through an elongated extraction aperture proving the ion beam as a ribbon beam. In some embodiments, a second ion beam may be extracted from the plasma, where ions of the second ion beam have trajectories forming a non-zero angle of incidence with respect to a perpendicular to a plane of the substrate. At block 506 the substrate the substrate is heated to a first temperature. The carbon layer deposits at a first deposition rate in the first region of the substrate, and deposits at a second deposition rate less than the first deposition rate in a second region of the substrate, where the second region is unexposed to the ion beam.

The present embodiments provide various advantages over known processing to deposit material on a substrate. One advantage lies in the ability to perform selective deposition in target regions on a substrate, including on target portions of a substrate feature having different surfaces extending along different directions. Another advantage is the ability to perform selective masking of target portions of a substrate feature. A further advantage is the ability to selectively grow a layer on target regions of a substrate while not using physical masking or lithography processes.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An apparatus to selectively deposit a carbon layer on a substrate, comprising:
   a plasma chamber to receive a flow of carbon-containing gas;
   a power source to generate a plasma containing the carbon-containing gas in the plasma chamber;
   an extraction plate configured to extract an ion beam from the plasma and direct the ion beam out of the plasma chamber to the substrate in order to deposit the carbon-containing layer on regions of the substrate that are exposed to the ion beam, the ion beam comprising ions having trajectories forming a non-zero angle of incidence with respect to a perpendicular to a plane of the substrate, the extraction plate further configured to conduct a neutral species derived from the carbon-containing gas to the substrate as a stream separate from the ion beam;
   a substrate stage disposed outside of the plasma chamber and facing the extraction plate, the substrate stage including a heater to heat the substrate to a first temperature, when the ion beam and neutral species impinge on the substrate; and
   a beam blocker disposed within the plasma chamber adjacent and separate from the extraction plate, wherein the beam blocker is positioned to block portions of the ion beam parallel to the perpendicular and to prevent the blocked portions of the ion beam from reaching the substrate, and wherein the beam blocker and extraction aperture are interoperative to extract the ion beam and a second ion beam from the plasma, wherein the ion beam defines a first angle of incidence with respect to the perpendicular and the second ion beam defines a second angle of incidence with respect to the perpendicular.

2. The apparatus of claim 1, the carbon-containing gas comprising a hydrocarbon gas.

3. The apparatus of claim 1, the plasma chamber further configured to receive hydrogen gas, wherein the neutral species include hydrogen species are derived at least in part from the hydrogen gas, and wherein the extraction plate is further configured to conduct the hydrogen species to the substrate.

4. The apparatus of claim 1, wherein the first temperature is greater than 100° C.

5. The apparatus of claim 1, the extraction plate comprising an extraction aperture configured to extract the ions from the plasma, wherein the non-zero angle of incidence spans a range up to 75 degrees with respect to the perpendicular.

6. The apparatus of claim 1, further comprising an inert gas source to provide inert gas to the plasma chamber, wherein the ion beam further comprises inert gas ions.

7. The apparatus of claim 1, wherein the substrate stage is configured to scan the substrate with respect to the extraction plate along a direction parallel to the plane of the substrate.

8. A method to selectively deposit a carbon layer on a substrate, comprising:
   providing at least one substrate feature on the substrate;
   generating a plasma in a plasma chamber using a hydrocarbon gas;

directing a first ion beam to a first portion of the substrate feature that extends above a surface of the substrate, the ion beam comprising ions extracted from the plasma, and the ions forming a non-zero angle of incidence with respect to a perpendicular to a plane of the substrate; and heating the substrate to a first temperature, wherein the carbon layer deposits at a first deposition rate in the first portion of the substrate feature, and deposits at a second deposition rate less than the first rate in a second portion of the substrate feature below the first region, the second portion being unexposed to the ion beam wherein directing the first ion beam comprises directing the first ion beam to a first part of a first sidewall of the substrate feature, the method further comprising directing a second ion beam to a first part of a second sidewall of the substrate feature, the second ion beam comprising additional ions extracted from the plasma, and the additional ions forming a second non-zero angle of incidence with respect to the perpendicular, wherein the carbon layer deposits at a third deposition rate on the first part of the second sidewall, the third deposition rate being greater than the second deposition rate.

9. The method of claim 8, wherein the substrate feature is exposed to the first ion beam and second ion beam simultaneously.

10. The method of claim 8, wherein the substrate feature is exposed to the first ion beam and second ion beam sequentially, the method further comprising scanning the substrate along a direction parallel to the plane of the substrate with respect to the first ion beam and second ion beam during the directing the first ion beam and the directing the second ion beam.

11. The method of claim 8, wherein the second deposition rate is zero.

12. The method of claim 8, wherein the directing the ion beam comprises providing the ions with an energy greater than 30 eV.

13. The method of claim 8, wherein the carbon-containing gas comprises a hydrocarbon gas.

14. The method of claim 8, further comprising providing hydrogen to the substrate, wherein the hydrogen etches the carbon layer at a first etch rate on the first region and etches the carbon layer at a second etch rate on the second region, the second etch rate being greater than the first etch rate.

15. The method of claim 8, wherein the first temperature is 100° C. or greater.

16. The method of claim 8, wherein directing the ion beam to the substrate comprises extracting the ion beam from the plasma through an extraction plate, the method further comprising scanning the substrate with respect to the extraction plate during the extracting the ion beam.

* * * * *